US008652768B1

(12) United States Patent
Huber et al.

(10) Patent No.: US 8,652,768 B1
(45) Date of Patent: Feb. 18, 2014

(54) NANOPATTERNS BY PHASE SEPARATION OF PATTERNED MIXED POLYMER MONOLAYERS (75) Inventors: Dale L. Huber, Albuquerque, NM (US); Amalie Frischknecht, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 109 days.

(21) Appl. No.: 13/361,228

(22) Filed: Jan. 30, 2012

Related U.S. Application Data (60) Provisional application No. 61/437,901, filed on Jan. 31, 2011.

(51) Int. Cl.
G03F 7/00 (2006.01)

(52) U.S. Cl.
USPC .......................................... 430/320; 427/402

(58) Field of Classification Search
USPC ............ 430/320, 322; 427/402; 428/413, 332
See application file for complete search history.

(56) References Cited

U.S. PATENT DOCUMENTS

| 6,423,465 | B1* | 7/2002 | Hawker et al. | 430/203 |
| 7,026,014 | B2* | 4/2006 | Luzinov et al. | 427/402 |
| 7,261,938 | B2* | 8/2007 | Luzinov et al. | 428/332 |
| 7,405,035 | B2* | 7/2008 | Kawamura et al. | 430/322 |
| 8,268,545 | B2* | 9/2012 | Xiao et al. | 430/324 |
| 2004/0185260 | A1* | 9/2004 | Luzinov et al. | 428/413 |
| 2006/0154081 | A1* | 7/2006 | Luzinov et al. | 428/414 |
| 2009/0305173 | A1* | 12/2009 | Xiao et al. | 430/324 |

* cited by examiner

Primary Examiner — Stewart Fraser
(74) Attorney, Agent, or Firm — Kevin W. Bieg (57) ABSTRACT Micron-size and sub-micron-size patterns on a substrate can direct the self-assembly of surface-bonded mixed polymer brushes to create nanoscale patterns in the phase-separated mixed polymer brush. The larger scale features, or patterns, can be defined by a variety of lithographic techniques, as well as other physical and chemical processes including but not limited to etching, grinding, and polishing. The polymer brushes preferably comprise vinyl polymers, such as polystyrene and poly(methyl methacrylate).

12 Claims, 6 Drawing Sheets

NANOPATTERNS BY PHASE SEPARATION OF PATTERNED MIXED POLYMER MONOLAYERS

CROSS-REFERENCE TO RELATED APPLICATION

This application claims the benefit of U.S. Provisional Application No. 61/437,901, filed Jan. 31, 2011, which is incorporated herein by reference.

STATEMENT OF GOVERNMENT INTEREST

The United States Government has rights in this invention pursuant to Department of Energy Contract No. DE-AC04-94AL85000 with Sandia Corporation.

FIELD OF THE INVENTION

The present invention relates to molecular self-assembly and, in particular, to a method for directing the self-assembly of mixed polymer brushes.

BACKGROUND OF THE INVENTION

When two chemically divergent molecules are put into close spatial proximity, they may self-organize by non-covalent interactions as a means of minimizing the overall energy of the system. This phenomenon, known as molecular self-assembly, when harnessed in a controlled fashion, has allowed for the exquisite engineering of nanostructures, such as lipid vesicles and liquid crystalline phases. While the technological implications of self-assembled systems have been the subject of intense research for decades, the industrial output of such technology has been scant. In contrast to bottom-up self-assembly, top-down lithography is a well-established industrial technology that allows for the patterning of geometrical designs with nanometer-level precision and accuracy. Lithography has been the workhorse of the microelectronics industry for decades with patterning techniques being highly developed. Though conventional lithography has achieved the continual shrinkage of surface features, it is widely believed that fundamental limitations will soon be reached. This provides the motivation for the exploration of self-assembled structures. In particular, recent efforts have striven to bring a greater degree of control to self-assembled structures by combining molecular self-assembly with lithographic techniques in a process known as templated self-assembly. By and large this field has been dominated by the use of block copolymers (polymers composed of chemically distinct blocks).

However, a need remains for a simple method for directing the self-assembly of mixed polymer brushes.

SUMMARY OF THE INVENTION

The present invention is directed to a method for directing the self-assembly of a mixed polymer brush, comprising patterning a region of a substrate with an attached first initiator; grafting at least one first polymer to the patterned region; attaching a second initiator to the unpatterned region of the substrate; grafting a second polymer to the unpatterned region and the patterned region to form a uniform brush of the second polymer in the unpatterned region and a mixed polymer brush of the at least one first polymer and the second polymer in the patterned region; and annealing the grafted polymers to direct from the unpatterned region a phase separation of the mixed polymer brush in the patterned region. The resulting phase-separated brush can have a nanoscale pattern. The patterning of the substrate can comprise soft lithography, photolithography, etching, grinding, or polishing. The at least one first polymer can comprise two or more different polymers that are phase-separated into periodic structures in the patterned region. The first or second initiator can comprise a functional organic molecule attached to the patterned or unpatterned region using a coupling agent. The coupling agent can comprise, but is not limited to, an amine, thiol, carboxylic acid, phosphonic acid, diazonium, or silane. The first or second initiator can comprise a free radical initiator. The free radical initiator can comprise, but is not limited to, an azo-containing initiator, peroxo-containing initiator, persulfate-containing initiator, or one-half of a redox-pair free radical initiator. The first and second initiator can be the same. The at least one first polymer or second polymer can comprise a vinyl polymer. The vinyl polymer can comprise, but is not limited to, polystyrene, poly(methyl methacrylate), poly(m-ethylacrylate), polyacrylamide, poly(N-isopropyl acrylamide), polyacrylic acid, polyvinylpyrrolidone, polyvinyl alcohol, polyvinyl butyral, polyvinyl chloride, polyvinyl nitrate, polybutadiene, or polyvinyl toluene. The substrate can comprise, but is not limited to, silicon, glass, quartz, polymer, gold, silver, metal, metal alloy, carbide, nitride, oxide, chalcogenide, or pnictide. The annealing can comprise heating or solubilizing the grafted polymers.

BRIEF DESCRIPTION OF THE DRAWINGS

The accompanying drawings, which are incorporated in and form part of the specification, illustrate some embodiments of the present invention and, together with the description, serve to explain the principles of the invention.

FIG. 3 is an illustration of initiator attachment onto aminated silicon surfaces.

DETAILED DESCRIPTION OF THE INVENTION

This invention is directed to a method of creating micron-size and sub-micron-size patterns that can direct the self-assembly of surface-bonded mixed polymer brushes to create nanoscale patterns in the phase-separated brush. The larger scale features, or patterns, can be defined by a variety of lithographic techniques, as well as other physical and chemical processes including but not limited to etching, grinding, and polishing. The larger scale directing feature can also be the end of the substrate, whether the substrate is large or small. Patterns can also be created by soft lithographic techniques and standard lithographic techniques using UV and/or visible light. A mixed polymer monolayer, or mixed polymer brush, is synthesized within the patterned features. Nanoscale phase separation of the mixed polymer layer will form parallel lines within micron-sized lines. Other, more complex features can also be replicated, where phase separation can form concentric circles, squares, stars, etc. Therefore, the process is not limited to systems that phase separate into parallel lines, so that nanoscale patterns can comprise, for example, arrays of circular or cylindrical domains in a square or hexagonal lattice that is formed in registry with the domain walls. Other more complex structures include bicontinuous domain structures as well as structures involving more than two phases which can exhibit a number of other structures.

Embodiments of the present invention use boundary interactions to orient nanoscale assemblies into long range ordered patterns. A polymer brush is obtained when long polymer molecules are covalently bonded to a substrate. The synthesis of mixed brushes can use inexpensive reagents, and the two components can phase separate very quickly since no component must diffuse more than a few tens of nm. Through a two-step polymerization scheme, micron-scale mixed polymer brush regions bordered by a region of pure polymer can be produced. The interaction with the pure polymer border directs the phase separation of the mixed polymer region parallel to this interface by first drawing the compatible polymer chains to the interface, forming a first nanoscale domain in the phase separation pattern. The remaining mixed region then phase separates to form parallel nanoscale domains. In some embodiments, new functional surfaces can be created by templating off the polymer nanopatterns.

Polymers are frequently used to modify the chemical properties of surfaces in order to tailor their wettability, surface friction, and biocompatibility. There are many methods of applying a polymer to a surface, the most common being physical deposition by spraying, spin-coating, or simply adsorption from solution. Alternatively, if reactive endgroups are present, polymers can be covalently linked to a surface creating a polymer brush. Compared to physically deposited polymers, covalently linked polymer brushes possess a greater degree of chemical and mechanical robustness. Polymer brushes may incorporate a chemical functionality onto the surface or may possess responsive properties that change the surface properties in response to the environment. Such polymers may change their physical properties such as wettability in response to triggers such as heat or pH.

Two methods exist for grafting a polymer to a surface to form a polymer brush: "grafting to" and "grafting from." In "grafting to," an assembled polymer with a reactive endgroup is covalently linked to the surface. While the experimental setup is conceptually simple, steric crowding of already adsorbed polymer can limit grafting densities with this method. In "grafting from," an initiator is covalently linked to the surface from which a polymer may be synthesized from monomer solution. This technique, also known as surface initiated polymerization, can provide very high grafting densities since only a monomer needs to diffuse to the reactive site of the growing polymer. High grafting densities of polymer ensure that the tethered chains interact with neighboring molecules. This facilitates the phase separation of the surface-bound polymers.

Figure 1:
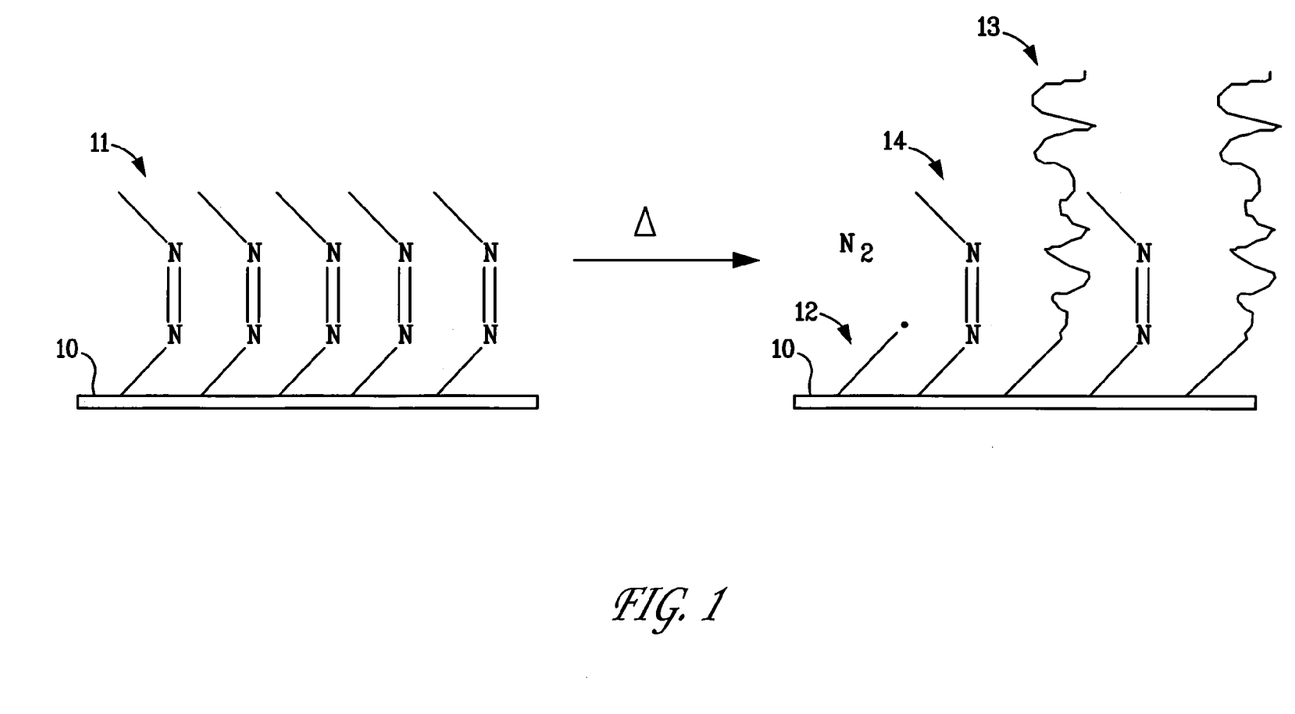
FIG. 1 is an illustration of an exemplary surface initiated polymerization from covalently attached azo initiators. Initiators thermally degrade releasing nitrogen and generating a surface bound free radical. In the presence of monomers, polymers grow becoming covalently attached to the surface.

For example, covalently linking a free radical initiator to the surface is one way of initiating polymerization from the surface. For example, as shown in FIG. 1, an azo-containing initiator 11 can be anchored to a surface 10 that degrades at a controlled, temperature-dependent rate when heat A is applied. The degrading initiator molecule releases diatomic nitrogen $N_2$ and produces a surface free radical 12 from which a first polymer 13 can grow. The controlled degradation of the initiator allows the reaction to be stopped before all the initiator is used up and the polymer growth terminated, if so desired. Subsequently, the unbound polymer can be removed, degradation of the remaining initiator 14 can be resumed, and a different second polymer can be grafted to the remaining surface radicals, thereby generating a mixed polymer brush. The interaction of the two polymers can drive their phase segregation. For example, in the work of Santer et al. an azo initiator was attached to a silane and covalently linked to a silicon surface. A mixed brush of polystyrene and poly(m-ethyl methacrylate) was grown and shown to phase segregate upon exposure to solvent vapors. See S. Santer et al., *Macromolecules* 39(8), 3056 (2006).

In various embodiments, different surfaces may be modified to create sites for attaching a polymer chain. In some embodiments, gold surfaces are readily modified by attachment of thiol-containing molecules. High quality monolayers can be formed on gold surfaces, but the weak bond strength of the gold-thiol chemistry can preclude its use in polymerizations requiring exposure to moderate heat. In some embodiments, the more robust layers formed by organosilanes on silicon surfaces can be employed. Organosilanes form a covalent attachment with surface silanols and neighboring silanes, creating a robust surface layer.

Figure 2:
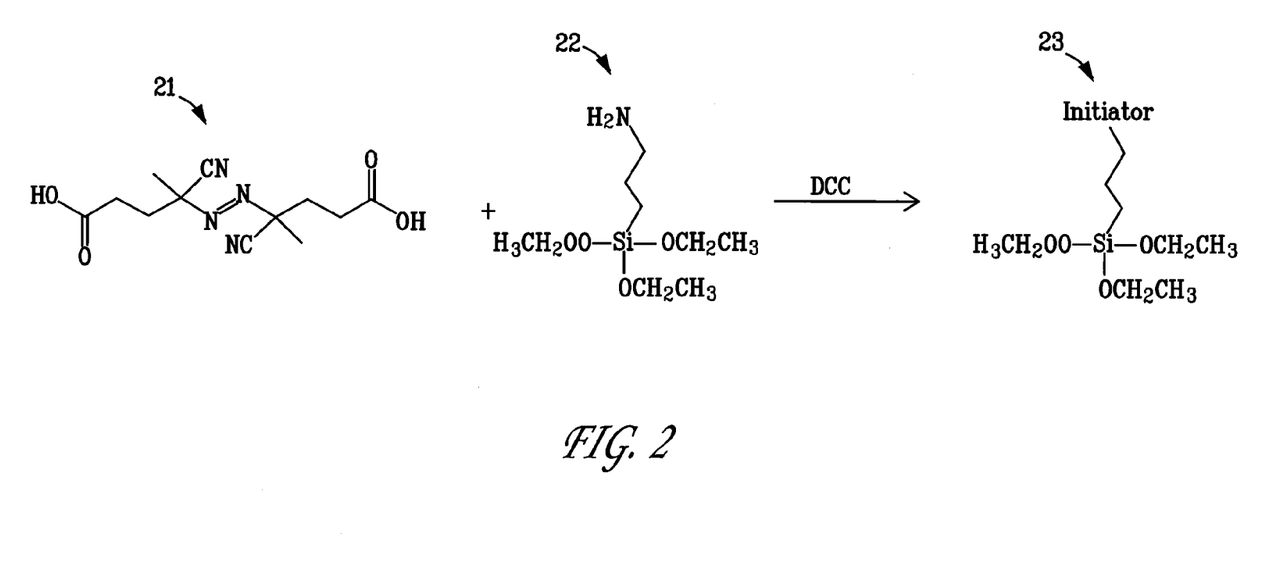
FIG. 2 is an illustration of the reaction of 4,4'-Azobis(4-cyanovaleric acid) and 3-aminopropyl-triethoxysilane via activation with dicyclohexylcarbodiimide that produces an amide linkage between the silane and the initiator allowing for its covalent attachment to a silicon surface.

In some embodiments, carbodiimide chemistry can be used to create an amide linkage between commercially available azo initiators and organosilanes, as shown in FIG. 2. In this example, into a minimal amount of anhydrous dichloromethane, 5 mmol of 4,4'-Azobis(4-cyanovaleric acid) (ACVA) 21 and 3.57 mmol 3-aminopropyltriethoxysilane 22 can be dissolved. To this mixture can be added 8 mmol dicyclohexylcarbodiimide (DCC) and 0.5 mmol pyridine catalyst which can be reacted at 35° C. for 4 hours under a nitrogen environment. Following the reaction, the insoluble byproduct can be filtered out and the solvent evaporated, optionally under rotary evaporation, yielding a viscous and oily yellow product. The shifting of the carbonyl peak from 1720 $cm^{-1}$ to ~1650 $cm^{-1}$ can be measured by infrared spectroscopy to confirm the formation of an amide linkage. Using this approach, an azo-containing silane initiator 23 is generated that can easily be attached to a silicon surface from an anhydrous solution of 2% silane in toluene aided by a catalytic amount of N,N,-diisopropylethylamine.

Figure 3A:
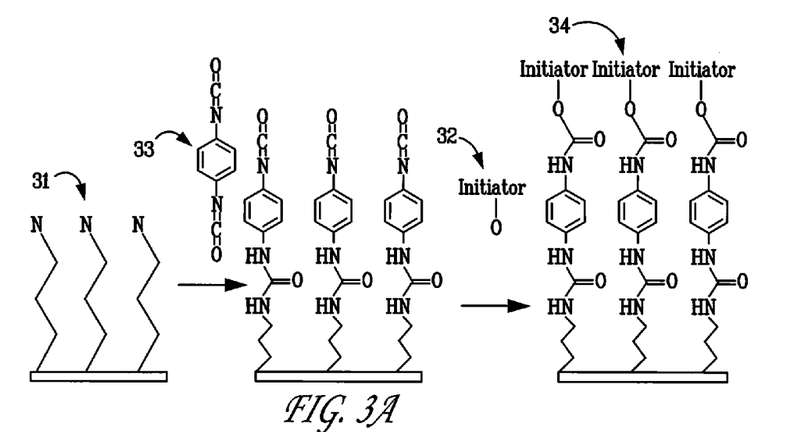
FIG. 3a shows the attachment of VA-086 by the use of a phenylene diisocyanate crosslinker.
Figure 3B:
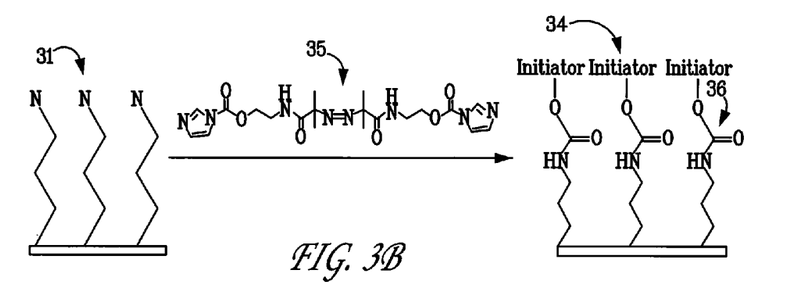
FIG. 3b shows the attachment of VA-086 via imidazole activation to a reactive intermediate.
Figure 3C:
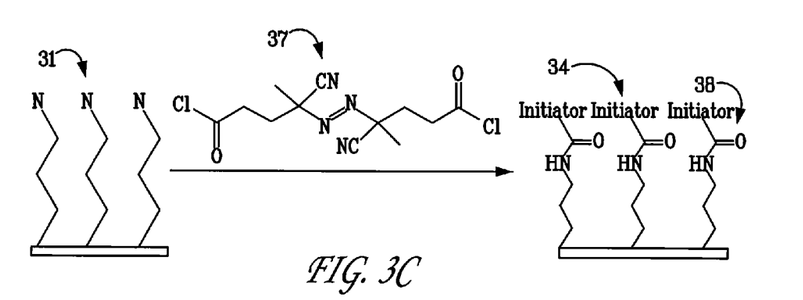
FIG. 3c shows the attachment of 4,4'-Azobis(4-cyanovaleric acid) via activation to an acid chloride intermediate.

In some embodiments, it may be desirable to modify the surface with a reactive layer for later attachment of an initiator. For example, a silicon surface can be modified to bear surface amines by reaction with 3-aminopropyltriethoxysilane. In this example, to a clean surface, the silane can be either deposited from a 95% acidified ethanol solution containing 2% silane for 45 min or by exposure to silane vapor. Covalent attachment occurs upon dehydration of the surface by exposure to 120° C. for 30 min. As shown in FIG. 3, a number of approaches can be used to attach an initiator 32 to the aminated surface 31 to provide an attached initiator 34. For example, as shown in FIG. 3a, reaction of an intermediate diisocyanate 33 can be employed. This reaction displays a tendency of the isocyanate to polymerize on the surface or hydrolyze to primary amines during the multi-step reaction. In some embodiments, activation of the initiator to a reactive intermediate can be employed as an alternative to isocyanate chemistry. For example, as shown in FIG. 3b, a reactive imidazole 35 can be created from VA-086 initiator. This intermediate is fairly stable yet reacts in the presence of a primary amine to create a stable carbamate linkage 36 to the attached initiator 34. For example, the activated initiator can be synthesized by reacting 1.00 g of VA-086 with 1.13 g carbonyldiimidazole in 15 ml of dichlormethane for 2 h under a nitrogen environment. The mixture can be washed twice with deionized water and once with sodium chloride brine and dried with magnesium chloride. The solvent can be evaporated to give a white solid. Variations of these details can be employed in various embodiments. Attachment of imidazole to the hydroxyl ends of the initiator can be confirmed by infrared spectroscopy and nuclear magnetic resonance. The bulky imidazole can inhibit efficient reaction of the molecule at the surface due to steric hindrance. Therefore, in some embodiments, the acid chloride of 4-4'-Azobis(4-cyanovaleric acid) (ACVA-Cl) 37 can be used for covalently attaching an initiator to the surface via the formation of an amide bond 38, as shown in FIG. 3c. The less bulky acid chloride provides good reactivity and, on average, increases the thickness of the surface by 0.4 nm upon reaction with the aminated silicon surface. ACVA-Cl can be synthesized by heating ACVA in a large excess of thionyl chloride for 10 min. A shift in the carbonyl peak from 1720 cm$^{-1}$ to 1797 cm$^{-1}$ can confirm the generation of the acyl chloride. Submersion of aminated silicon into a 1 mg mL$^{-1}$ solution of ACVA-Cl in anhydrous toluene containing 0.1% triethylamine for 30 min is sufficient to attach the initiator to the surface. Other reaction times can also be employed provided sufficient reaction occurs.

The attached initiators enable the growth of polymers via the "grafting from" method. Polymer growth is dependent on a number of variables including but not limited to monomer concentration, solvent, reaction temperature, reaction time, and extent of initiator attachment. The polymerization process can involve submerging silicon chips with attached initiator into a degassed monomer solution and heating for a set time period. In some embodiments, solutions of styrene or methyl methacrylate in toluene can be used to graft polymer to the attached initiator. For example, reactions can be allowed to proceed at 70° C. for 4,4'-Azobis(4-cyanovaleric acid) or 86° C. for VA-086 initiators for approximately 8 h. Other times and temperatures can also be employed. Following reaction, unbound polymer can be removed from the silicon chips by extraction in dichloromethane for 24 h. Other extraction times can be used. In some embodiments with surface bound initiators, polymer growth generally ranged between 10-50 nm for 8 h polymerizations of styrene or methyl methacrylate, as measured by ellipsometry.

As described above, polymer growth can proceed by grafting from surface attached initiators. Alternatively, the growing polymers can covalently link to the surface via chain transfer to surface functionalities. For example, polystyrene attachment to native silicon surfaces as well as silicon modified with 3-aminopropyltriethoxysilane or 3-mercaptopropyltrimethoxysilane to exhibit amine or thiol functionalities, respectively, can be employed. For example, free radical initiator (1 mg/ml azobisisobutyronitrile (AIBN) can be added to initiate polymerization of polystyrene in solution. Other free radical initiators can also be used. Following extraction, thickness of the bound polymer can be measured using ellipsometry. The results for some examples are summarized in Table 1. These results follow expectations of the chain transfer ability of surface chemistries.

TABLE 1

Covalent polystyrene attachment to silicon and silicon-modified surfaces via chain transfer from polymer growth in solution

| Surface Functionality | Polystyrene Thickness (nm) |
|---|---|
| Silanols (silicon dioxide) | 4.4 ± 1.0 |
| Primary amines | 5.4 ± 2.6 |
| Thiols | 11.1 ± 2.2 |

Mixed polymer brushes can be created using a two-step polymerization scheme. Following the first polymerization and Soxhlet extraction, as described above, the silicon chips can be subjected to a second polymerization in the presence of a different monomer. To use most if not all of the remaining surface-bound initiators, the second polymerization can be carried out for 20 h. Phase separated structures of the mixed polymer brushes resulting from this two-step polymerization are described below.

Without structural guidance, mixed polymer brushes display patterns generated by polymer self-assembly that are a random pattern of polymer domains. At approximately equal grafting densities of the two polymers, the domains are somewhat reminiscent of the fingerprint pattern exhibited by block copolymer self-assembled domains on flat surfaces. To align the meandering domains into parallel structures, block copolymer systems can introduce surface gratings into the underlying substrate which creates regions of high and low surface energies. At appropriate periodicities of the underlying grating, the copolymer domains can be aligned. In embodiments of the present invention, a chemical pattern is introduced into the brush structure with the intent of inducing alignment of the polymer domains. The method is to pattern the surfaces to contain regions of mixed polymer brushes surrounded by polymer brushes of single polymer chemistry. At the boundaries between mixed and uniform brushes, a component of the mixed brush will be preferentially attracted to the boundary creating a periodicity that propagates into the mixed region.

Figure 4:
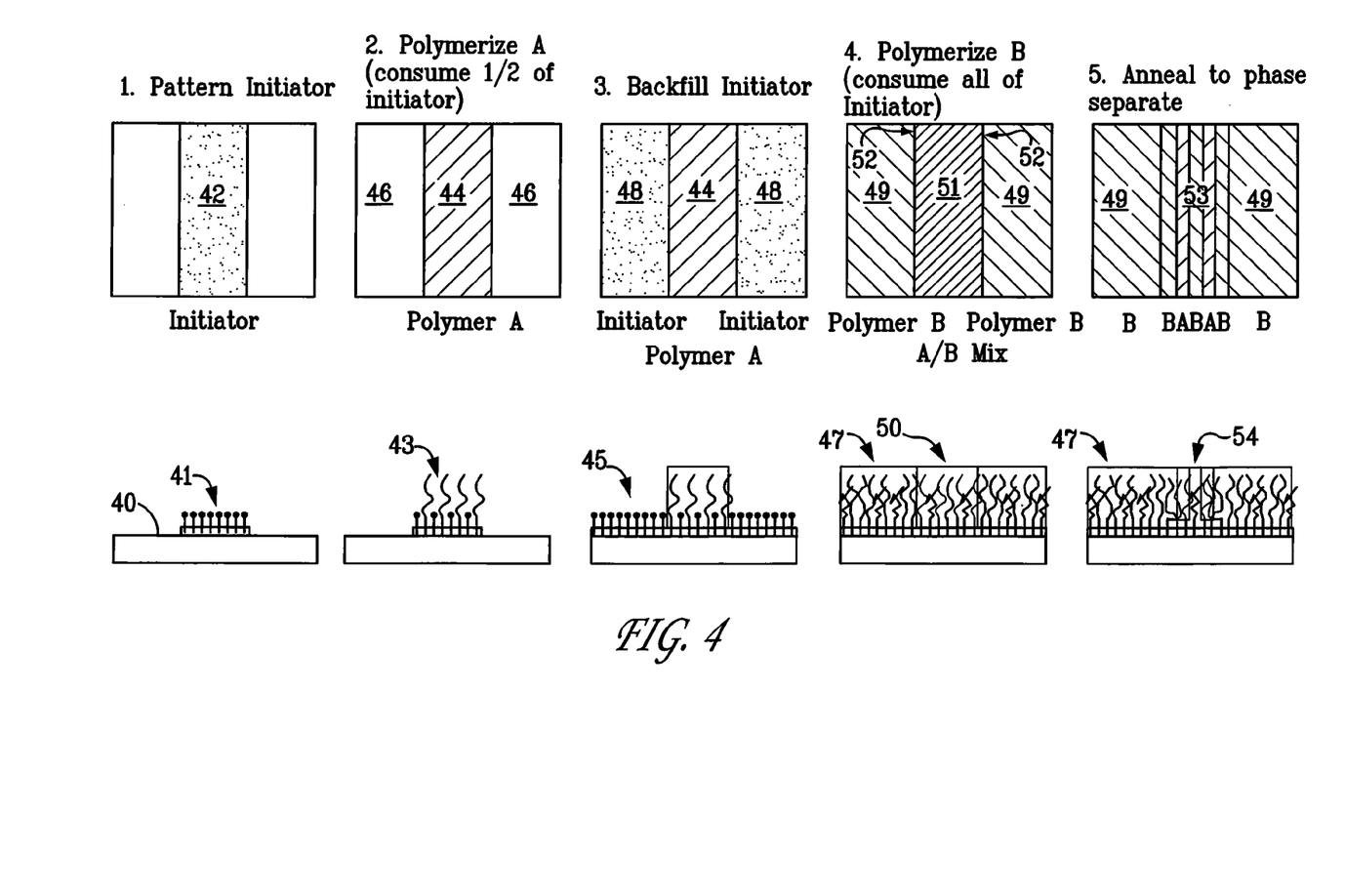
FIG. 4 is an illustration of an exemplary method to pattern the surface into domains of mixed and single polymer brushes. First, an initiator is patterned onto the substrate and the first polymer is grown from the region consuming some of the initiator. The surrounding regions are then backfilled with initiator and a second polymerization with a different second polymer consumes the remaining initiator in the first patterned region and the initiator in the surrounding regions. Generated are regions of mixed polymer brushes surround by a uniform polymer brush. Upon annealing, the mixed polymer brush phase separates into domains driven by the geometry of the patterned substrate.

According to the present invention, as shown in FIG. 4, an attached initiator 41 can be patterned on a region 42 of a substrate 40. For example, soft lithography and photolithography are two lithographic approaches for patterning the attached initiator that can be employed in various embodiments. The patterned initiator 41 can be partially polymerized with a first polymer 43, for example, by submerging the substrate with the patterned initiator into a degassed first monomer solution and heating for a set time period to graft the first polymer 43 to the attached initiator 41 in the patterned region 42 to provide a partially polymerized patterned region 44. The controlled consumption of the initiator allows the polymerization reaction to be stopped and the growth of the first polymer terminated before all the patterned initiator is used up. Subsequently, the unbound first polymer can be removed and additional initiator 45 can be attached to the unpatterned regions 46 of the substrate. The substrate can then be submerged into a second monomer solution to graft a second polymer 47 to the unpatterned regions 48 and the partially polymerized patterned region 44, thereby consuming all of the remaining attached initiator. This two-step polymerization will create a uniform brush 47 of the first polymer in the unpatterned region 49 of the substrate and a mixed polymer brush 50 in the patterned region 51. Next, the substrate can be annealed to phase separate the mixed polymer brush in the patterned region 51. At the boundaries 52 between mixed 50 and uniform brush 47 regions, a component of the mixed brush will be preferentially attracted creating a periodicity that propagates into the mixed region to provide a phase-separated patterned region 53 with a nanoscale domain pattern 54.

In general, an initiator can be a functional organic molecule attached to the surface using a coupling agent. For example, the coupling agent can comprise, but is not limited to, an amine, thiol, carboxylic acid, phosphonic acid, diazonium, or silane. The initiator can be free radical initiator. For example, the free radical initiator can comprise, but is not limited to, an azo-containing initiator, peroxo-containing initiator, persulfate-containing initiator, or one-half of a redox-pair free radical initiator. The substrate can comprise, but is not limited to, silicon, glass, quartz, polymer, gold, silver, metal, metal alloy, carbide, nitride, oxide, chalcogenide, or pnictide. The polymers used to form the brushes preferably comprise vinyl polymers, such as polystyrene, poly(methyl methacrylate), poly(methylacrylate), polyacrylamide, poly(N-isopropyl acrylamide), polyacrylic acid, polyvinylpyrrolidone, polyvinyl alcohol, polyvinyl butyral, polyvinyl chloride, polyvinyl nitrate, polybutadiene, or polyvinyl toluene.

A variety of techniques can be used to create the patterned initiator region. For embodiments with a resolution down to approximately 1 micrometer, a poly(dimethylsiloxane) (PDMS) stamp can be used to deposit an "ink" on the surface in a process known as microcontact printing. The stamp is typically created by pouring uncured PDMS over a patterned master and curing. When peeled from the master, the hardened PDMS will contain an inverse replica of the master. In some embodiments, microcontact printing can be used to stamp an ink of hexamethylene diisocyanate or 3-aminopropyltrimethoxysilane onto aminated or clean silicon surfaces respectively. These surface modifications provide the chemical functionalities for subsequent initiator attachment. For example, a 2% solution of the ink in toluene can be coated onto the PDMS stamp surface and spread by spinning at 4000 rpm for 30 seconds, followed by another 30 second spin under a stream of nitrogen to dry the stamp. The stamp can then put in contact with the silicon surface for 10-60 seconds. Light pressure to the stamp can be applied to ensure even wetting of the silicon surface. In some cases, the ink migrates from the stamped region into the holes and more material becomes deposited around the edge of the features. This may be due to a combination of poor wetting of the PDMS surface by the ink and significant diffusion of the ink (both from stamped regions in contact with the sample and through the small air layer present between the surface and stamp features).

A good ink for microcontact printing would have a combination of the following characteristics: even wetting of the stamp surface, quick bonding, and minimal spreading of the ink to non-stamped features. Literature reports have demonstrated quality features from stamping octadecyltrichlorosilane (OTCS) onto a silicon surface. The hydrophobic ink evenly spreads onto the PDMS stamp and has minimal vapor pressure, minimizing ink that will contact non-contacted surface via diffusion through air. In addition, chlorosilane chemistries react very quickly with surface silanols forming a covalent linkage to the surface. A reliable procedure for stamping OTCS onto clean silica was developed. First, a glass pipet was silanized to inhibit the formation of silane aggregates from the inside surface of the pipet. Following, a 2% solution of OTCS in toluene was coated onto the PDMS stamp surface and spread by spinning at 4000 rpm for 30 seconds, followed by another 30 second spin under a stream of nitrogen to dry the stamp. The stamp was then put in contact with the silicon surface for 60 seconds. Light pressure applied to the stamp ensured even wetting of the silicon surface. Ellipsometry images showed even coverage of the silane to contacted surfaces with minimal spreading into stamp features. The features could then be backfilled with another silane, such as 3-aminopropyltriethoxysilane that can act as an anchor for initiator using a surface chemistry reported in the previous section.

Photolithography using commercially available photoresists provides a more conventional method for patterning the surface of silicon that can be used in some embodiments. For example, using a UV/Visible light source, a thin layer of photoresist can be exposed through a chromium mask. The exposed photoresist becomes soluble in a developer solution (in the case of a positive photoresist) allowing selective exposure and protection of the surface. Such a process was exploited to create regions of chemical functionality on the surface of a silicon wafer. First, a wafer was cleaned with piranha solution and coated with a thin layer of 3-aminopropylsilane by a vapor deposition process where the wafer was exposed to 3-aminopropyltriethoxysilane vapor within a vacuum chamber. Ellipsometry confirmed deposition of a thin and even multilayer of silane corresponding to a layer on the order of 3-5 molecules thick. A positive photoresist, such as for example AZ5214e photoresist, can be spread onto the silicon wafer by spinning at 5000 rpm for 30 sec. The pattern was exposed and developed according to the directions of the manufacturer leaving features protected by photoresist. The amine layer on the exposed surface was etched away by exposure to a $CF_4/O_2$ reactive ion etch. Liftoff of the photoresist gave regions of surface amines surround by silicon dioxide. The existence of amines on the surfaces can be verified by attaching fluorescein isothiocyanate (FITC) to the aminated regions and imaging by fluorescence microscopy.

Figure 5A:
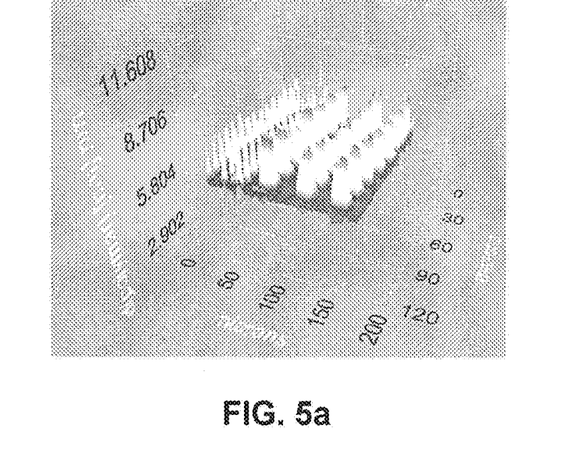
FIG. 5a shows imaging ellipsometry measurements of poly (methyl methacrylate) (PMMA) brushes grown from an initiator patterned surface. The area between features is backfilled with a second initiator.
Figure 5B:
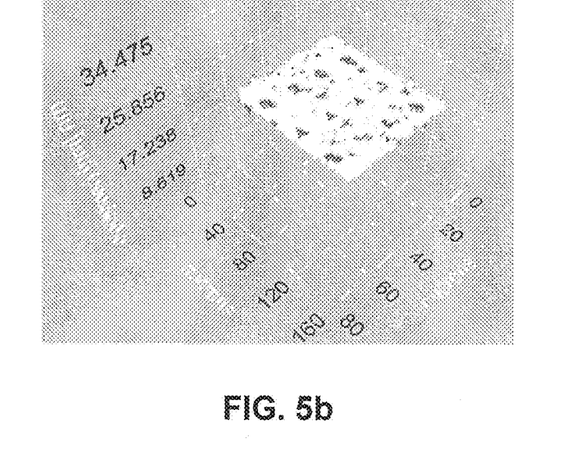
FIG. 5b shows imaging ellipsometry measurements of polystyrene (PS) brushes subsequently grown creating areas of mixed brushes (shapes) surrounded by mixed regions rich in PS. The composition of mixed brush (shapes) is approximately 40% PMMA and 60% PS.

In various embodiments, patterned surfaces can be functionalized with free radical initiators and subjected to a polymerization in a solution of styrene or methyl methacrylate, as described above. Following polymerization of the first polymer, non-covalently bound polymer can be removed by Soxhlet extraction (or other suitable techniques) in dichloromethane for 24 h. Different extraction times can also be employed. The temperature of the solvent in the extractor (35° C.) does not significantly degrade unreacted initiator at the surface. Regions surrounding the attached first polymer can be backfilled with initiator and the silicon chips can be subjected to a second round of polymerization in a different monomer. Following the second polymerization, unbound polymer can be removed by Soxhlet extraction (or other suitable techniques) in toluene for 24 h. Different extraction times can be employed. With the foregoing process, regions of mixed homopolymer brushes surrounded by regions of mostly single polymer brushes are formed. An imaging ellipsometry image is shown in FIG. 5. Due to chain transfer effects, the single polymer region is actually a mixture with a composition of one polymer greater than 80% in this example. FIG. 5a shows imaging ellipsometry measurements of PMMA brushes grown from an initiator patterned surface. The area between features is backfilled with a second initiator. FIG. 5b shows imaging ellipsometry measurements of PS brushes subsequently grown creating areas of mixed brushes (shapes) surrounded by mixed regions rich in PS. Composition of mixed brush (shapes) is about 40% PMMA and 60% PS.

Figure 6:
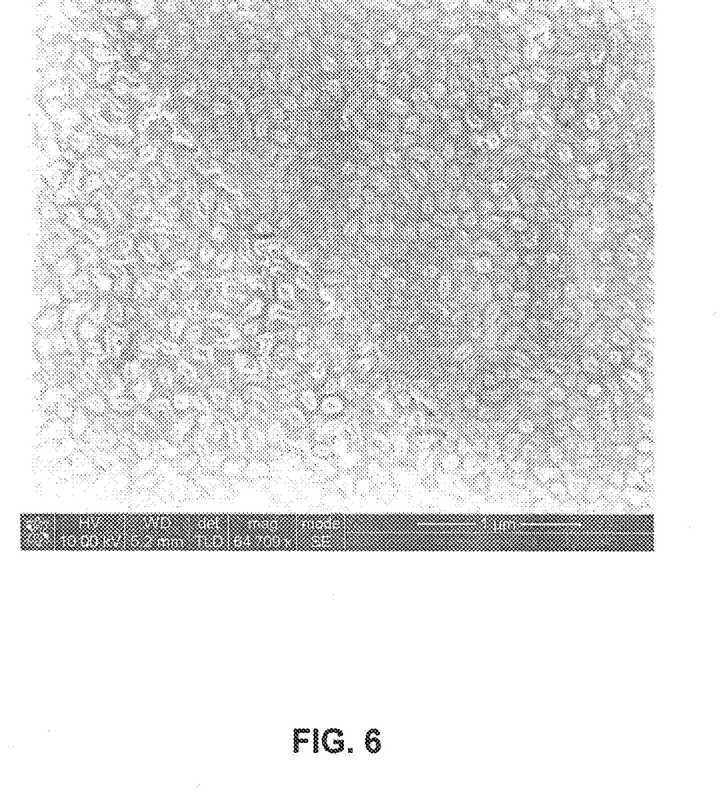
FIG. 6 is a scanning electron micrograph (SEM) image of the boundary between two regions of mixed homopolymer brushes annealed by exposure to acetone. The lower left region is approximately 55% PMMA and 45% PS and the upper right region is approximately 75% PMMA and 25% PS.

To induce self-assembled domains in the mixed polymer brushes, the polymer chains must be made sufficiently mobile, a process known as annealing. Typically this is achieved in block copolymer films by heating the sample above the glass transition temperature of the polymer. Such an annealing process can be very slow and can take upwards of several weeks for self-assembled domains to form. With polymer brushes, solvent systems, either as liquid or vapor, can be used to solubilize the polymer chains. The preferential solubility of the polymer for a particular solvent can be used to additionally affect the arrangement of the polymer phases. The domains can exhibit a range of geometries primarily dependent on the compositions of the brushes. For example, while a lamellar geometry is expected for approximately equal amounts of the two polymers, cylindrical or spherical domain structures form when the composition of the mixed brush is richer in one polymer. More complex geometries are possible where three or more polymers are present. Surface height and viscoelastic topography can be imaged by scanning electron microscopy (SEM) and atomic force microscopy (AFM). FIG. 6 shows an SEM image of a boundary between two regions of mixed polymer brushes annealed by exposure to acetone. The lower left region is approximately 55% PMMA and 45% PS while the upper right region is approximately 75% PMMA and 25% PS. The lower left region appears to be in the process of forming a bicontinuous phase while the upper right exhibits individual cylinders of PS surrounded by a continuous region of PMMA. Under proper annealing conditions, the shift in composition at the interface will drive the arrangement of the self-assembled domains.

The foregoing description of the invention has been presented for purposes of illustration and description and is not intended to be exhaustive or to limit the invention to the precise form disclosed, and obviously many modifications and variations are possible in light of the above teaching. The embodiments were chosen and described in order to explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A method for directing the self-assembly of a mixed polymer brush, comprising:
    patterning a region of a substrate with an attached first initiator to provide a patterned region and an unpatterned region;
    grafting a first polymer to the patterned region;
    attaching a second initiator to the unpatterned region of the substrate;
    grafting a second polymer to the unpatterned region and the patterned region to form a uniform brush of the second polymer in the unpatterned region and a mixed polymer brush of the first polymer and the second polymer in the patterned region; and
    annealing the grafted polymers to direct a phase separation from the uniform brush of the unpatterned region into the mixed polymer brush of the patterned region to provide a phase-separated patterned region.

2. The method of claim 1, wherein the patterning a region of a substrate comprises soft lithography or photolithography.

3. The method of claim 1, wherein the patterning a region of a substrate comprises etching, grinding, or polishing.

4. The method of claim 1, wherein the first or second initiator comprises a functional organic molecule attached to the patterned or unpatterned region using a coupling agent.

5. The method of claim 4, wherein the coupling agent comprises an amine, thiol, carboxylic acid, phosphonic acid, diazonium, or silane.

6. The method of claim 1, wherein the first or second initiator comprises a free radical initiator.

7. The method of claim 6, wherein the free radical initiator comprises an azo-containing initiator, peroxo-containing initiator, persulfate-containing initiator, or one-half of a redox-pair free radical initiator.

8. The method of claim 1, wherein the first polymer or second polymer comprises a vinyl polymer.

9. The method of claim 8, wherein the vinyl polymer comprises polystyrene, poly(methyl methacrylate), poly(methylacrylate), polyacrylamide, poly(N-isopropyl acrylamide), polyacrylic acid, polyvinylpyrrolidone, polyvinyl alcohol, polyvinyl butyral, polyvinyl chloride, polyvinyl nitrate, polybutadiene, or polyvinyl toluene.

10. The method of claim 1, wherein the substrate comprises silicon, glass, quartz, polymer, gold, silver, metal, metal alloy, carbide, nitride, oxide, chalcogenide, or pnictide.

11. The method of claim 1, wherein the annealing comprises heating the grafted polymers.

12. The method of claim 1, wherein the annealing comprises solubilizing the grafted polymers.

* * * * *